United States Patent

[11] 3,568,113

[72] Inventors Rudolf Hopt;
Rudolf Mayer, Rottweil, Germany
[21] Appl. No. 801,106
[22] Filed Feb. 20, 1969
[45] Patented Mar. 2, 1971
[73] Assignee R & E Hopt KG
Rottweil, Germany
[32] Priority Feb. 22, 1968
[33] Germany
[31] P 16 16 268.8

[54] VISUAL INDICATION MEANS FOR A PUSHBUTTON TUNER

5 Claims, 1 Drawing Fig.

[52] U.S. Cl. 334/7, 325/455, 334/86, 334/87, 338/196
[51] Int. Cl. H03j 1/04, H03j 5/32
[50] Field of Search 334/7, 15, 86, 87; 338/196; 325/455

[56] References Cited

UNITED STATES PATENTS

| | | | |
|---|---|---|---|
| 2,260,088 | 10/1941 | Polydoroff | 334/87X |
| 2,354,148 | 7/1944 | Shaw | 334/7X |
| 2,356,935 | 8/1944 | Koch | 334/87X |
| 2,774,063 | 12/1956 | Grinstead et al. | 338/196X |

FOREIGN PATENTS

| | | | |
|---|---|---|---|
| 1,088,990 | 10/1967 | Great Britain | 334/7 |

*Primary Examiner*—Paul L. Gensler
*Attorney*—Craig, Antonelli, Stewart & Hill

ABSTRACT: A tuning device of radio frequency communication equipment employs a plurality of tuning spindles with which are associated scales and tuning element pointers. A depressable key, through which each scale and pointer is visible, is arranged with each spindle to actuate a switch element for tuning the desired frequency channel.

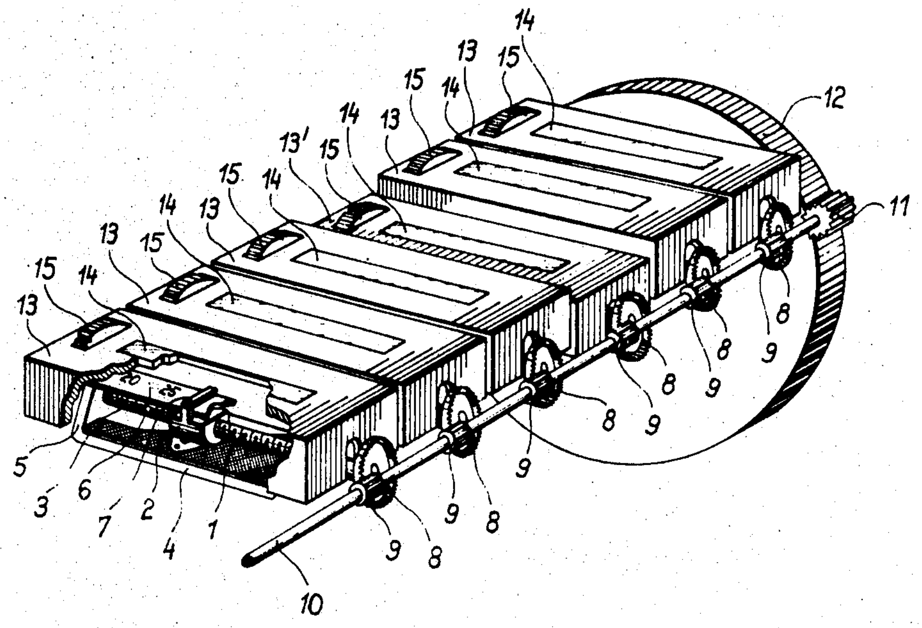
INVENTORS
RUDOLF HOPT
RUDOLF MAYER
BY Craig, Antonelli, Stewart & Hill
ATTORNEYS

VISUAL INDICATION MEANS FOR A PUSHBUTTON TUNER

The present invention relates to a tuning device for radio frequency communication equipment, especially television receivers, comprising several parallel mounted tuning spindles, each carrying an adjustable tuning element, in particular the sliding wiper of a potentiometer; a scale assembly associated with each tuning spindle having center axes parallel to the center axes of the tuning spindles; and a key associated with each tuning spindle designed to switch the tuning spindle and element into the operative state.

In the known tuning devices of this kind, the keys are arranged in a row at the scale ends, thus forming a panel with a plurality of parallel extending scales and, at the ends of these scales, keys or pushbuttons which can be rotated for tuning. As the space available for such tuning devices is restricted, each scale and the associated knob is very small; the arrangement is therefore highly compact and inconvenient to survey and thus difficult to operate. Nor can it be seen at first glance which of the channels comprising a tuning spindle, tuning element, scale, and pushbutton is switched on and to which frequency it is adjusted.

It is the purpose of the present invention to provide a clear, readily surveyed tuning device which is of relatively simple design and does not need too much space inside the equipment to which it is fixed. According to this invention, this is achieved with a key used in place of the pushbutton and arranged over the scale with which the corresponding tuning spindle is associated in such a manner that the scale is visible through the key. In accordance with the invention, the whole key may be manufactured of a transparent material, for instance, pellucid plastics, although a window in the otherwise opaque key is preferable as only the scale of the depressed key will then be visible if use is made of another feature of the invention to be presently described.

The keys thus provided in accordance with the invention have the advantage of clear survey of the keyboard where a depressed key is immediately discerned. The first glance thus reveals which of the keys is depressed, that is, which of the channels is switched on. At the same time, the observer's eye is caught by, and directed to the scale visible through the key window so that the selected channel can be told offhand. At the same time the scale and/or the key window can be so shaped that the scale reading is clearly visible only in the depressed state of a key. This is achieved, for instance, by providing each key with a lens-shaped, convex window so the scale arranged behind the window will become clearly readable only when the associated key is depressed and its window is therefore moved close to the scale face.

In a preferred embodiment in accordance with this invention, the scale base is provided between the window of the key and the associated tuning spindle while a pointer mounted on the tuning element connected with the tuning spindle extends over the scale base facing the key window. However, it is possible to apply the scale markings directly to the inside of the key window and to shape the pointer in such a manner that it comes close to the inner window face when the key is depressed. The key will then be visible only in the depressed key position while the tuning will not be visible through the windows of nondepressed keys.

The key in accordance with this invention offers an additional advantage inasmuch as a switch knob can be arranged in the key so as to engage with its operating lugs in a frequency band switch whenever it is depressed together with the key. In this way, a band changeover operation is readily achieved and clearly visible while the clear survey of the keyboard and the tuning state chosen is fully retained.

In a preferred embodiment of the invention, the tuning device is combined with a central tuning mechanism and the keys cooperate with mechanical coupling elements linking the tuning spindle with the central tuning device whenever the key is depressed. This eliminates the need for a tuning knob for each of the tuning spindles, all of which are substituted by a knob common to all tuning spindles. In this way, a very clear and yet compact keyboard complete with tuning panel is obtained which is easily controlled and virtually eliminates the possibility of tuning errors.

Further details and features will become evident from the following description of an embodiment of the invention with reference to the drawing hereto attached. The features that will become apparent from this description and drawing may be singly or severally used in any combination in other embodiments of the invention.

The drawing shows a perspective and schematic view of an embodiment of the invention with the first key broken off to show the interior arrangement.

Six tuning spindles are arranged in a common frame in parallel relation to one another, only the first spindle 1 being visible. This spindle mounts a nonrotational potentiometer wiper 2 interacting with the resistor 3 provided on the base 4 of the said common frame. A scale base 6 is attached to the upper edges of the frame walls 5 and has scale markings on its surface facing topwards. A pointer 7 interacting with the scale 6 is fixed to the wiper 2 sliding along the spindle axis and extends over the front face of scale 6. Obviously turning of the tuning spindle 1 will move the sliding wiper 2 along the resistive layer 3 to influence any tuning circuit in which the potentiometer may be inserted. To rotate the tuning spindle 1, its shaft protrudes from the said common frame in which it is supported and mounts the crown wheel 8. Each of the crown wheels 8 engages with a pinion 9 supported by a tuning shaft 10 which extends laterally past the tuning units. The far end of the shaft 10 in the drawing mounts a gear 11 engaging with the teeth of a tuning wheel 12. Wheel 12 is arranged in parallel relation to the tuning units in such a way that a segment of it may protrude from a slot in the cabinet.

Each tuning unit comprising the potentiometer 1, 2, 3, and the scale assembly 6, 7 is concealed inside and under a key 13. All keys 13 are mounted in a parallel closely spaced arrangement. Each key 13 has a window 14 through which the scale 6 with pointer 7 is visible. The tuner or outer faces of the windows can be convex-shaped to act as a converging lens making the scale markings visible only when the distance between window and scale is reduced. Each key of the keyboard can be depressed from its idle position toward and parallel to the tuning spindles 1 into a position shown for the fourth key 13' in the drawing; on pushing the said key, the said potentiometer arranged below the key is switched into a tuning circuit by conventional means which are not shown.

At the same time, the depression of the key mechanically operates some linkage cam mechanism or the like so that the crown wheel 8 on the associated tuning spindle engages with pinion 9 on the tuning shaft 10. Thus a tuning spindle 1 is linked with the central tuning device 10, 11, 12 only if its associated key is depressed. The key also supports a band switch control knob 15 having operating lugs not shown within the key 13 through which it actuates the contacts of a band changeover switch. Through this means, the tuning unit associated with any one key may be operated in any one of several frequency bands.

The invention thus obviously provides a tuning device that is very compact and yet clearly overviewed. A first glance on the keyboard reveals which one of a plurality of tuning units is operative. The adjustment of the tuning unit switched on can readily be changed with the central tuning device 10, 11, 12 which arrangement precludes any error as to which tuning unit adjustment is to be changed. There is also enough space for unimpeded manual tuning. Furthermore, the conspicuous position of a depressed key catches the eye and directs it to the associated scale, which of all scales may be the only one that is clearly visible.

It should be understood that this invention is not confined to the embodiment described which only serves the purpose of explaining the idea of the invention the design details of which have been omitted. The invention can be used with keys of many different designs and is independent of whether a central tuning device is used or not and whether band switching control knobs are mounted in the keys or not.

We claim:

1. A tuning device for radio frequency communication equipment, comprising:

a plurality of parallel tuning spindles;

an adjustable potentiometer wiper slidably mounted on each tuning spindle;

a pointer attached to said wiper;

a scale arranged parallel to said spindle and cooperating with said pointer to give a visual indication of the position of said wiper with respect to said spindle; and a key, for actuating switches to determine the function of each tuning element, disposed above each pointer and scale arrangement whereby said scale and pointer arrangement is visible through said key.

2. A tuning device according to claim 1, wherein said key contains a window through which said scale becomes visible when said key is depressed.

3. A tuning device according to claim 2, wherein said scale has a base, one surface of which faces said window, disposed between said window of said key and its associated spindle and over which surface said pointer extends.

4. A tuning device according to claim 1, further including an adjustable switching means supported on said key, for engaging with a switch of said tuning device, when said key is depressed.

5. A tuning device according to claim 1, further including a common tuning shaft having linkage mounted thereon for connecting said spindle with said shaft when said key is depressed.